(12) United States Patent
Gudino et al.

(10) Patent No.: US 8,294,465 B2
(45) Date of Patent: Oct. 23, 2012

(54) SWITCHED MODE PRE-AMPLIFICATION AND AM FEEDBACK FOR ON-COIL SWITCHED MODE AMPLIFIERS IN PARALLEL TRANSMISSION MRI

(76) Inventors: Natalia Gudino, Cleveland Heights, OH (US); Jeremiah A. Heilman, University Heights, OH (US); Mark A. Griswold, Shaker Heights, OH (US); Markus Vester, Nuremberg (DE)

( * ) Notice: Subject to any disclaimer, the term of this patent is extended or adjusted under 35 U.S.C. 154(b) by 392 days.

(21) Appl. No.: 12/750,808

(22) Filed: Mar. 31, 2010

(65) Prior Publication Data

US 2011/0241685 A1    Oct. 6, 2011

(51) Int. Cl.
 *G01V 3/00* (2006.01)
(52) U.S. Cl. ...................................... 324/318; 324/322

(58) Field of Classification Search ........... 324/300–322
See application file for complete search history.

(56) References Cited

U.S. PATENT DOCUMENTS

| 5,682,883 A * | 11/1997 | Fiat .............................. 600/323 |
| 6,593,812 B2 | 7/2003 | Sundstrom |
| 7,671,595 B2 * | 3/2010 | Griswold et al. ............. 324/322 |
| 8,169,221 B2 * | 5/2012 | Griswold et al. ............. 324/322 |
| 2011/0241682 A1 * | 10/2011 | Gudino et al. ................ 324/318 |

* cited by examiner

*Primary Examiner* — Brij Shrivastav

(57) ABSTRACT

Example systems, apparatus, circuits, and so on described herein concern parallel transmission in MRI with on-coil current-mode (CMCD) amplifiers. One example apparatus includes switched voltage-mode class D (VMCD) pre-amplifiers. Another example apparatus includes amplitude modulation of the output of the CMCD amplifiers using feedback control based, at least in part, on a comparison of an envelope of transmit coil current to an envelope of an input RF pulse.

24 Claims, 10 Drawing Sheets

SWITCHED MODE PRE-AMPLIFICATION AND AM FEEDBACK FOR ON-COIL SWITCHED MODE AMPLIFIERS IN PARALLEL TRANSMISSION MRI

COPYRIGHT NOTICE

A portion of the disclosure of this patent document contains material subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic resonance imaging (MRI) involves the transmission of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Using multiple receivers facilitates speeding up signal reception, which in turn may reduce scan time. Similarly, multiple transmitters may be used in parallel transmission techniques. Using multiple transmitters may facilitate speeding up a transmission process, which in turn may facilitate volumetric excitation, selective isolation, and other very high speed features. However, conventional parallel transmission techniques have encountered issues with scaling, fidelity, and synchronization.

Conventional systems may have attempted to parallelize their existing RF transmitters. Thus, conventional systems may have relied on multiple, individually powered, single channel, analog-in-analog-out RF transmitters for parallel transmission. These systems tended not to scale well due to cabling duplication, power transmitter duplication, control duplication, and other issues. Even when a small number (e.g., 4) of transmitters were employed, these systems may not have produced desired fidelity. For example, conventional systems may have had complicated power distribution management and may have been difficult to synchronize. Additionally, conventional systems typically had poor isolation between coils, resulting in degraded performance. Furthermore, these systems may have required each element in an array to be tuned and matched, which is a very time-consuming procedure.

Conventional systems may also have been limited by their use of relatively low power (e.g., <50 W), low efficiency class A or class AB amplifiers. While some systems may have included on-coil series and/or shunt-fed class-D amplifiers, even these conventional systems have suffered from several limitations including inadequate detuning and low efficiency. Proposed systems that indicate that they may achieve higher efficiency still appear to lack adequate control mechanisms. Due, at least in part, to these limitations, conventional systems may not have produced desired levels of amplitude and/or phase control and thus may have had less than desirable fidelity.

U.S. Pat. No. 7,671,595 ("the '595 patent) to Griswold et al. which issued on Mar. 2, 2010, and is entitled "On-coil Switched Mode Amplifier for Parallel Transmission in MRI" describes an on-coil current-mode class-D (CMCD) amplifier that may be used to produce MRI transmission coil excitations at desired RF frequencies. The on-coil CMCD amplifier is capable of performing within or proximate to the bore of the MRI magnet or within less than one wavelength of the amplifier from the transmit coil. Providing an on-coil amplifier allows digital control signals to be sent to the coil assembly, improving synchronization between the transmission coils while reducing interference, cross talk, physical space requirements associated with cables, and heating normally associated with parallel transmission MRI systems. The on-coil CMCD amplifier described in the '595 patent is driven by signals produced by one or more linear pre-amplifiers.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

DETAILED DESCRIPTION

Figure 1:
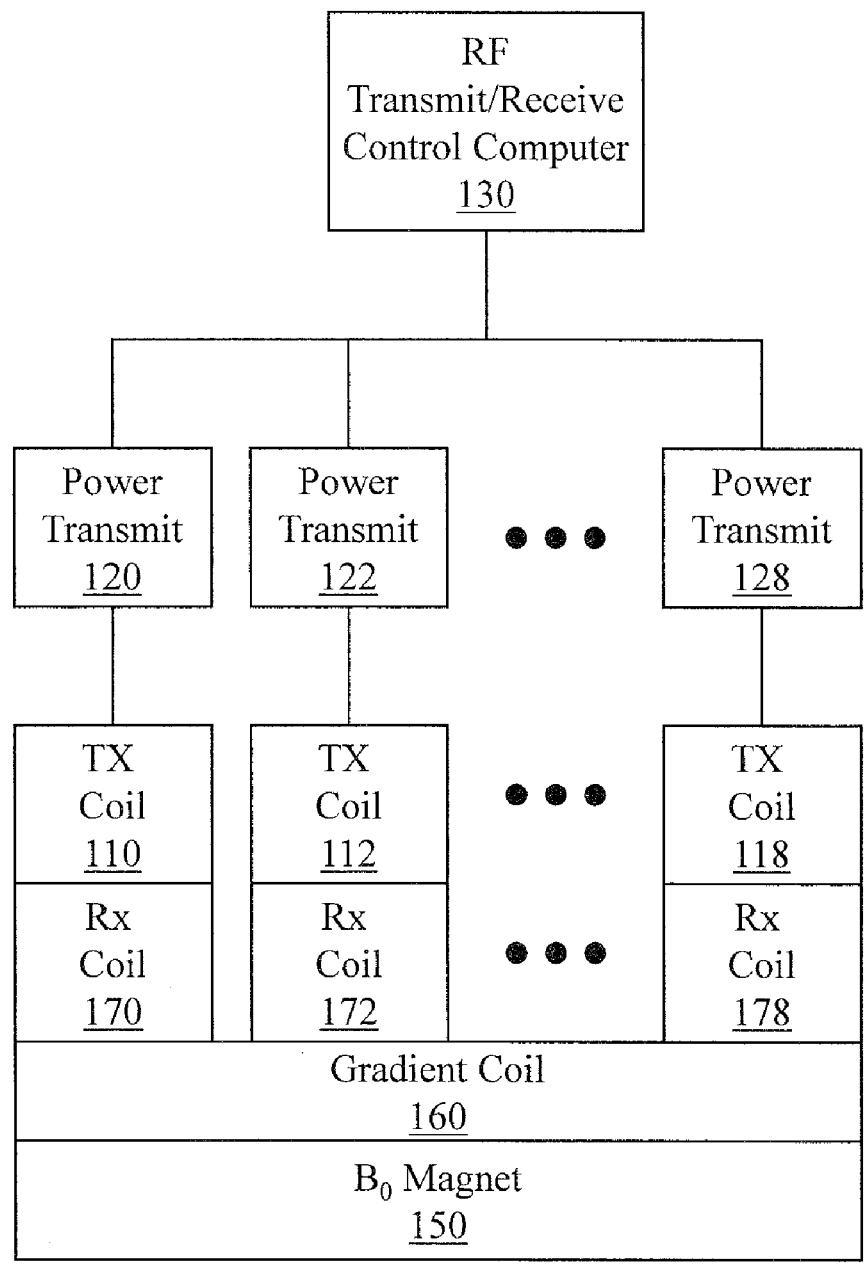
FIG. 1 illustrates portions of a conventional parallel MRI apparatus.

Prior Art FIG. 1 illustrates a conventional parallel transmission MRI system that used multiple independent external transmitters (e.g., 120, 122 . . . 128), multiple transmit coils (e.g., 110, 112 . . . 118) and multiple receive coils (e.g., 170, 172 . . . 178). Once again the system would also have included other components (e.g., main field magnet 150, gradient coil 160, and so on). This conventional system could perform both parallel acquisition and parallel transmission. However, this system may have suffered from the limitations described above including, for example, scaling, synchronization, interference between coils, and so on. The system presented each transmit coil with an analog signal and each transmit coil produced an analog signal. Each transmit coil was powered by a separate power transmitter and was connected to its power transmitter by a separate coaxial cable. The power transmitters may have been controlled by a computer 130.

The system illustrated in FIG. 1 did not scale well due to power transmitter proliferation, tuning and matching requirements, cable proliferation and coupling, and power consumption increases. The sheer volume of the multiple power transmitters and multiple cables made physical design difficult. The power required to drive all the transmitters and the resulting heat produced by all these transmitters created additional design issues. Furthermore, cable paths and coil design may have produced cross talk issues, interference issues, and so on. Synchronization of the transmit coils was difficult, if possible, to achieve and often involved cable length and connection engineering issues.

Figure 2:
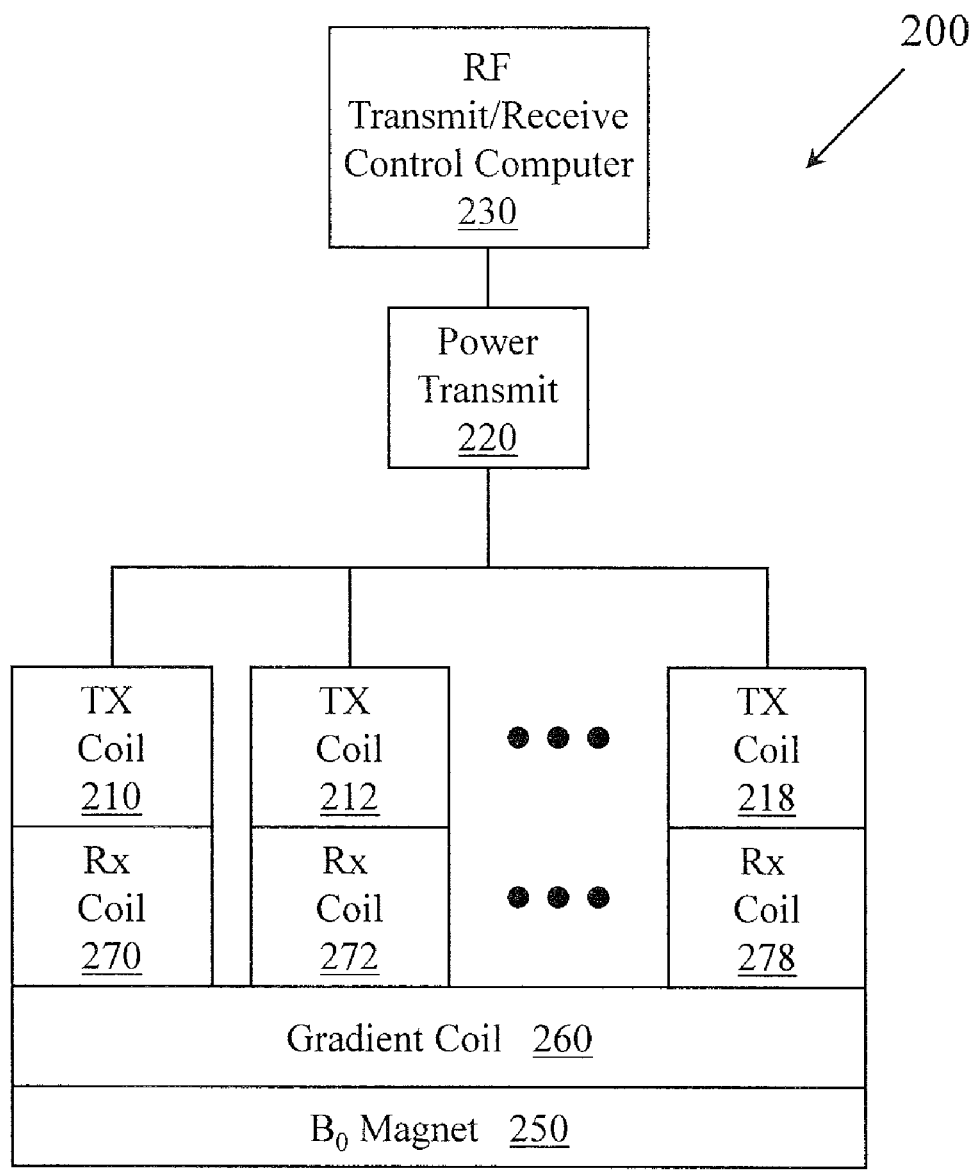
FIG. 2 illustrates portions of a parallel MRI apparatus configured with an on-coil switched mode amplifier.

FIG. 2 illustrates an example system 200 that uses multiple independent transmit coils (e.g., 210, 212 . . . 218) and multiple receive coils (e.g., 270, 272 . . . 278). The transmit coils illustrated in FIG. 2 (and FIG. 3) are described in more detail in the '595 patent. The transmit coils have on-coil switched mode amplifiers that facilitate improved parallel transmission in MRI. The transmit coils may be powered by digital controllers (e.g., power transmitters 220) that are controlled by a computer 230. The transmit coils may receive a digital signal and produce an analog signal having improved characteristics. The system also includes other standard MRI apparatus elements (e.g., main field magnet 250, gradient coils 260, and so on).

Figure 3:
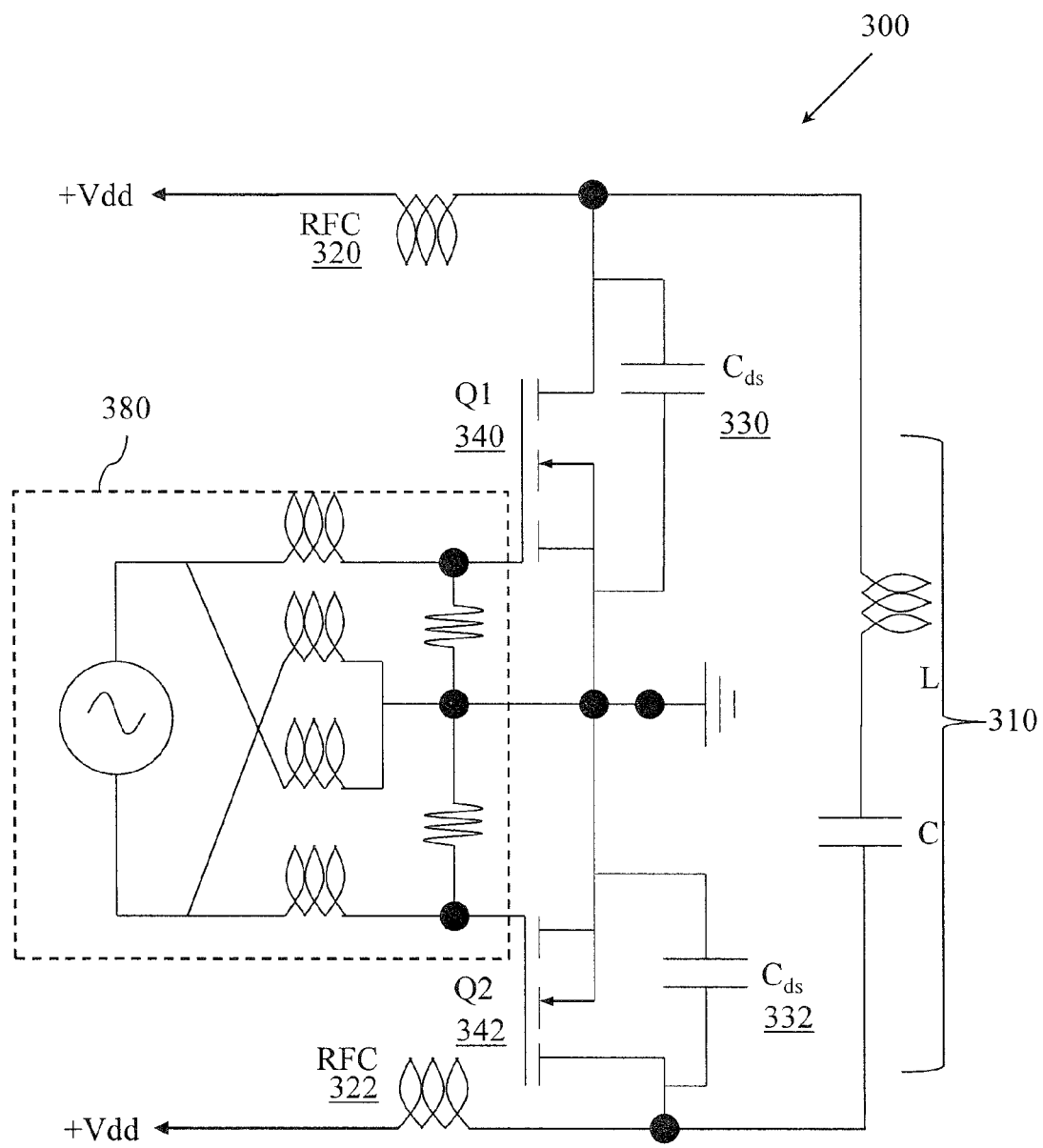
FIG. 3 illustrates a current-mode class-D (CMCD) amplifier topology for use in parallel MRI transmission involving on-coil switched-mode amplification.

FIG. 3 illustrates an example CMCD amplifier topology 300 similar to the CMCD amplifier described in the '595 patent. An MRI transmit coil configured with this topology may be referred to as an L-C-switched-mode coil. In the illustration, the coil is represented by the series LC leg 310. The L refers to inductance in the coil 310 and the C refers to capacitance in the coil 310. The two chokes RFC (e.g., 320, 322) act as current sources. The drain-source capacitances $C_{ds}$ (e.g., 330, 332) are in series with the coil 310. Alternative shunting of an applied DC voltage to ground as an FET is driven to saturation produces excitation at desired RF frequencies. Alternative shunting of an applied DC voltage to ground as an FET is driven to saturation produces excitation at desired RF frequencies. The signal that drives the FETs to saturation is provided by linear circuit 380 that includes an RF transmission unit. The coil 310 terminals are attached between the drains of two FETs (Q1 340, Q2 342) and tuned so that the circuit is series resonant when one of the FETs is switched on.

Figure 4:
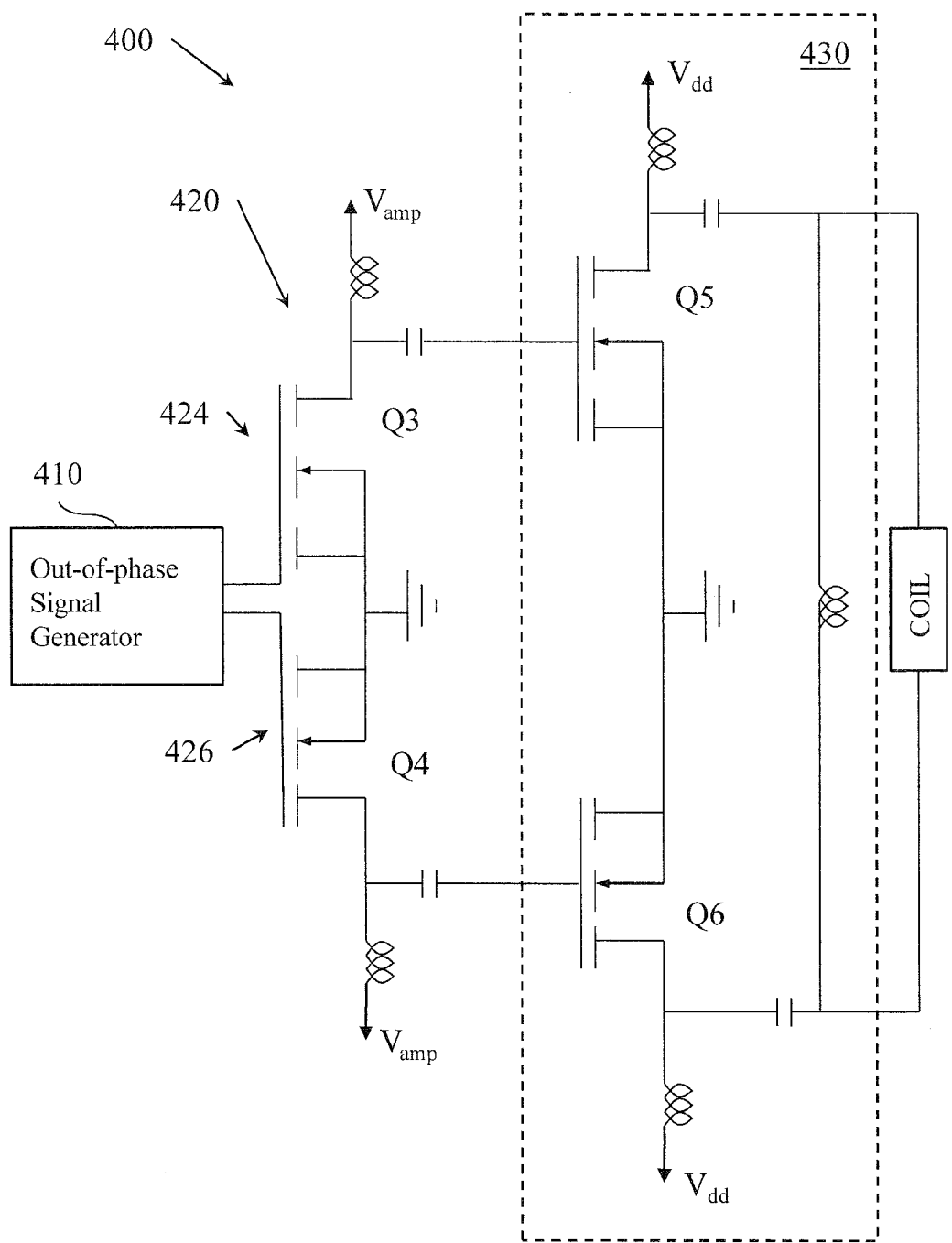
FIG. 4 illustrates a CMCD amplifier topology for use in parallel MRI transmission including VMCD pre-amplifiers.

FIG. 4 illustrates an example CMCD topology 400 that includes an out-of-phase signal generator 410 and a switched voltage-mode class-D (VMCD) pre-amplification stage 420 that pre-amplifies signals provided to an on-coil CMCD amplifier 430. It can be seen that the on-coil CMCD amplifier 430 is similar to the CMCD amplifier shown in FIG. 3 and includes two CMCD FETs Q5, Q6 that are driven by the output of the pre-amplification stage 420.

The out-of-phase signal generator 410 generates two out-of-phase RF signals and can be implemented in many ways one of which will be described below with reference to FIGS. 5 and 7. The pre-amplification stage 420 includes first and second VMCD amplifiers 424, 426 that are configured to amplify one of the out-of-phase RF signals. In the described embodiment, the first and second VMCD amplifiers include FETs Q3, Q4 which can be MOSFETs or any other suitable switch device. The first and second VMCD amplifiers 424 and 426 drive one of the CMCD FETs by selectively providing a pre-amplifier voltage ($V_{amp}$) to a gate of the driven CMCD FET. The switched mode pre-amplification stage 420 is configured to boost the out-of-phase RF signals from the out-of-phase signal generator 410 to a voltage level that will efficiently switch the CMCD FETs.

Figure 5:
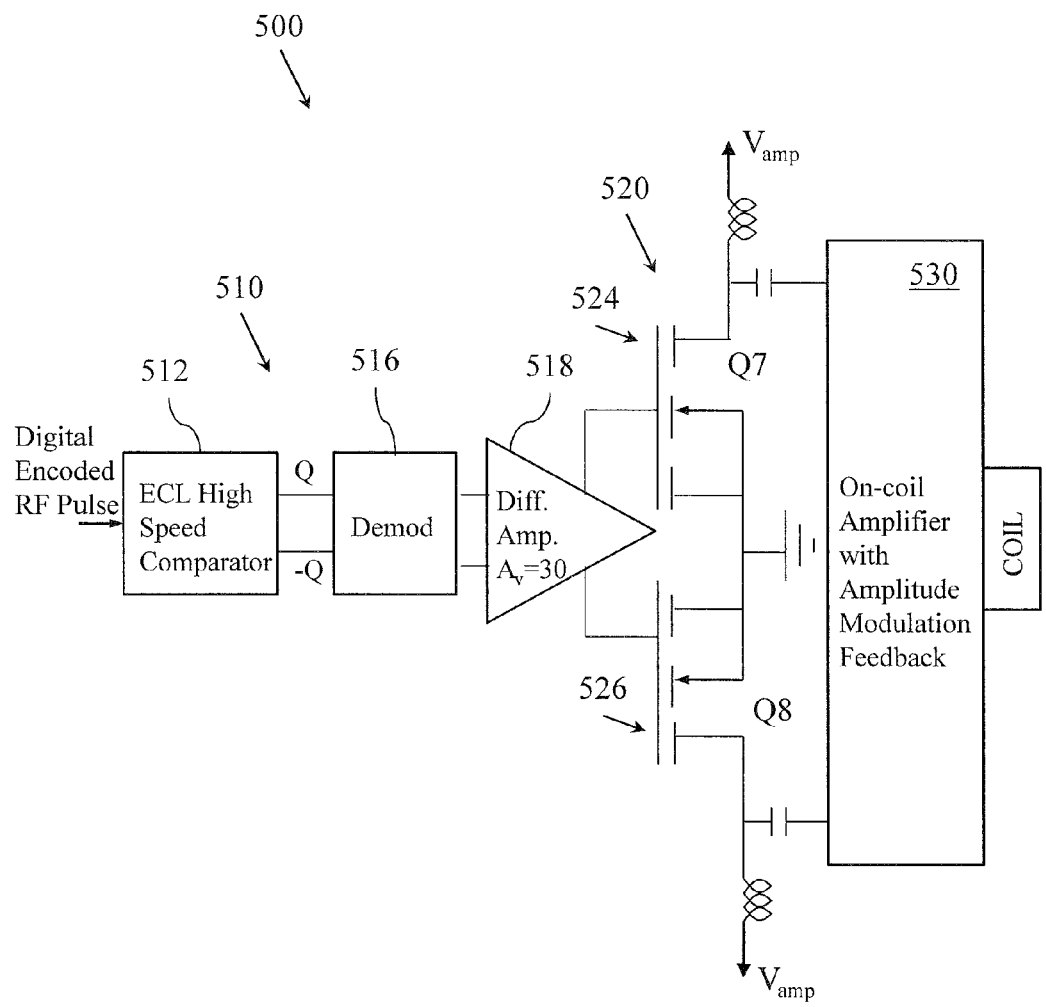
FIG. 5 illustrates a CMCD amplifier topology for use in parallel MRI transmission including VMCD pre-amplifiers.

FIG. 5 illustrates a CMCD topology 500 that includes a pre-amplification stage 520 similar to the pre-amplification stage 420 of FIG. 4. The pre-amplification stage includes first and second VMCD amplifiers 524, 526 that drive an on-coil CMCD amplifier 530 similar to on-coil amplifier 430 and shown schematically in block form for simplicity. The topology 500 is configured to be driven by a digital encoded RF pulse. The encoded RF pulse is amplified and split into two out-of-phase signals (Q and −Q) through a high speed Emitter Coupled Logic (ECL) comparator 512. The out-of-phase signals are demodulated through a band pass filter 516 and further amplified through a differential amplifier 518. The differential amplifier 518 may include a cascade of high-speed differential amplifiers. The demodulated and amplified out-of-phase signals are further amplified by the pre-amplification stage 520 and after pre-amplification have sufficient strength to drive the on-coil CMCD amplifier 530.

In one embodiment, a 0.8V peak to peak digital encoded RF pulse is transformed through the pre-amplification stage (with a $V_{amp}$ of 28V) to a 55 V peak to peak signal, which, in many instances, will be sufficient to efficiently switch the on-coil CMCD amplifier. Due to the switched mode operation of the pre-amplification stage 620, the CMCD amplifier may need to include additional components to provide amplitude modulation for its output RF signal, as will be described in more detail below.

Figure 6:
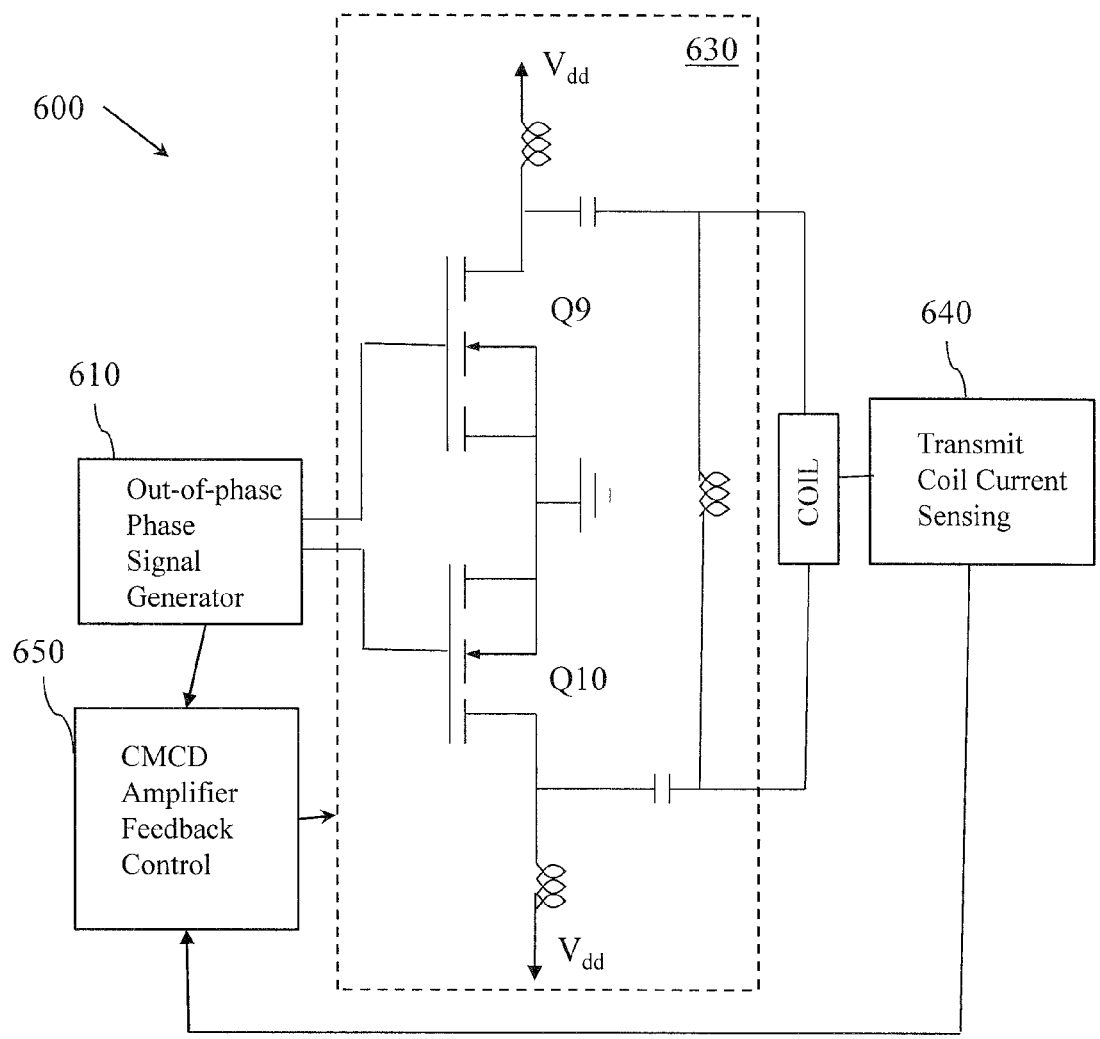
FIG. 6 illustrates a CMCD amplifier topology for use in parallel MRI transmission including feedback control.

FIG. 6 illustrates a CMCD topology 600 that includes an on-coil CMCD amplifier 630 similar to CMCD amplifiers 430 and 530 (FIGS. 4 and 5). The CMCD amplifier 630 includes an amplitude modulation system that uses feedback to modulate the amplitude of the RF signal output by the CMCD amplifier 630. The CMCD amplifier 630 is driven by an out-of-phase signal generator 610 that provides switching voltages of sufficient strength to efficiently switch CMCD FETs Q9, Q10. The signals from the out-of-phase signal generator 610 are generated based on an input RF pulse having a desired frequency. To achieve sufficient switching voltages, the out-of-phase signal generator 610 may include a pre-amplification stage similar to the pre-amplification stages 420, 520 (FIGS. 4 and 5) as well as a signal generator similar to the signal generator 510 (FIG. 5).

The topology 600 includes a CMCD amplifier feedback controller 650 to modulate the amplitude of the output signal of the on-coil CMCD amplifier 630. The feedback controller 650 receives signals indicative of a transmit coil current from a transmit coil current sensing unit 640. The feedback controller 650 also receives signals indicative of the input RF pulse from the out-of-phase signal generator 610. The feedback controller 650 compares the signals indicative of the transmit coil current to the signals indicative of the input RF pulse and modulates an amplitude of the output of the CMCD amplifier 630 based, at least in part, on this comparison.

Figure 7:
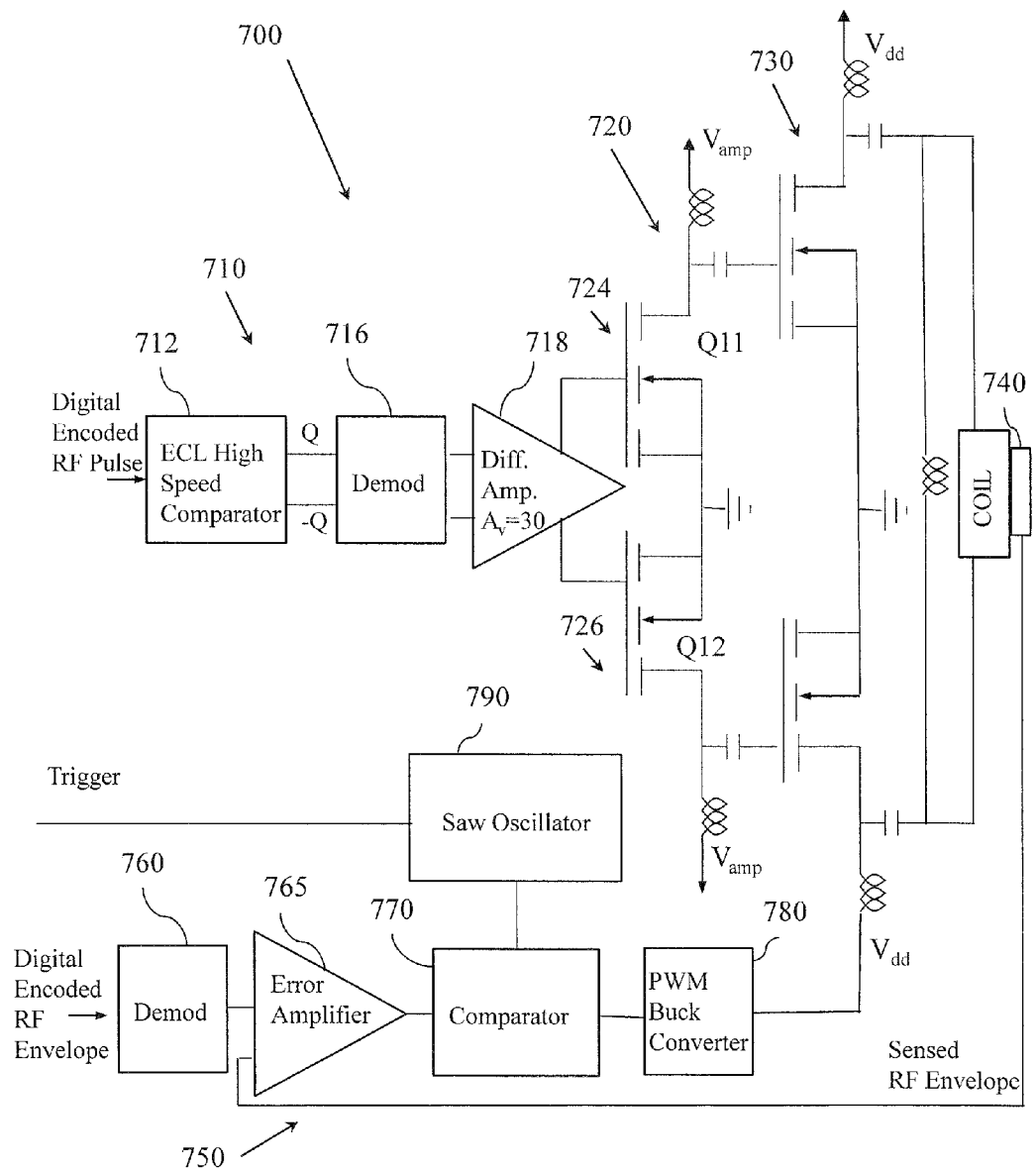
FIG. 7 illustrates a CMCD amplifier topology for use in parallel MRI transmission including VMCD amplifiers and feedback control.

FIG. 7 illustrates a CMCD amplifier topology 700 that includes an on-coil CMCD amplifier 730 similar to CMCD amplifier 630 (FIG. 6) and an out-of-phase signal generator 710 similar to the out-of-phase signal generator 510 of FIG. 5 and a VMCD pre-amplification stage 720 similar to the VMCD pre-amplification stages 420, 520 of FIGS. 4 and 5, respectively. The pre-amplification stage 720 includes first and second VMCD amplifiers 724, 726 that drive an on-coil CMCD amplifier 730 similar to on-coil amplifiers 430 and 630 (FIGS. 4 and 6).

The topology 700 is configured to be driven by a digital encoded RF pulse. The encoded RF pulse is amplified and split into two out-of-phase signals (Q and −Q) through a high speed Emitter Coupled Logic (ECL) comparator 712. The out-of-phase signals are demodulated through a band pass filter 716 and further amplified through a differential amplifier 718. The differential amplifier 718 may include a cascade of high-speed differential amplifiers. The demodulated and amplified out-of-phase signals are further amplified by the pre-amplification stage 720 and after pre-amplification have sufficient strength to drive the on-coil CMCD amplifier 730.

The topology 700 includes a feedback controller 750 similar to the feedback controller 650 of FIG. 6. The feedback controller 750 modulates the amplitude of the output signal from the on-coil CMCD amplifier 730 based on the envelope of the input digital encoded pulse as compared to the envelope of the current flowing in the transmit coil. The feedback controller 750 includes a demodulator that demodulates a signal indicative of an envelope of the digital encoded RF pulse and inputs the envelope to an error amplifier 765. A current envelope sensor 740 is coupled to the transmit coil and provides an envelope of the transmit coil current to an error amplifier 765. The current envelope sensor 740 may be implemented by coupling a wire loop to the transmit coil and passing the demodulated signal through a low-pass filter with a cutoff frequency below the coil resonant frequency (e.g., 63.6 MHz at 1.5 T field strength).

An output of the error amplifier 765 is provided to a comparator 770. The comparator 770 combines the output of the error amplifier with an output of a saw oscillator 790 and thus acts as an oscillator to generate a pulse width modulated (PWM) signal based on the comparison of the input RF signal envelope and the envelope of the transmit coil current. This PWM signal is used to control a modified buck converter 780 connected to the power stage for the CMCD amplifier. The buck converter 780 modulates the amplitude of the RF signal output by the CMCD amplifier 730. A trigger signal is sent to the saw oscillator 790 to avoid any false switching when no RF pulse is present. In this manner, the feedback controller 750 modulates an amplitude of the output of the CMCD amplifier based, at least in part, on a comparison between envelopes of the input RF pulse and the transmit coil current. Sensing and comparing signal envelopes rather than sensing and comparing the signals themselves is less complex, which facilitates topology 700 providing improved performance over other systems.

Figure 8:
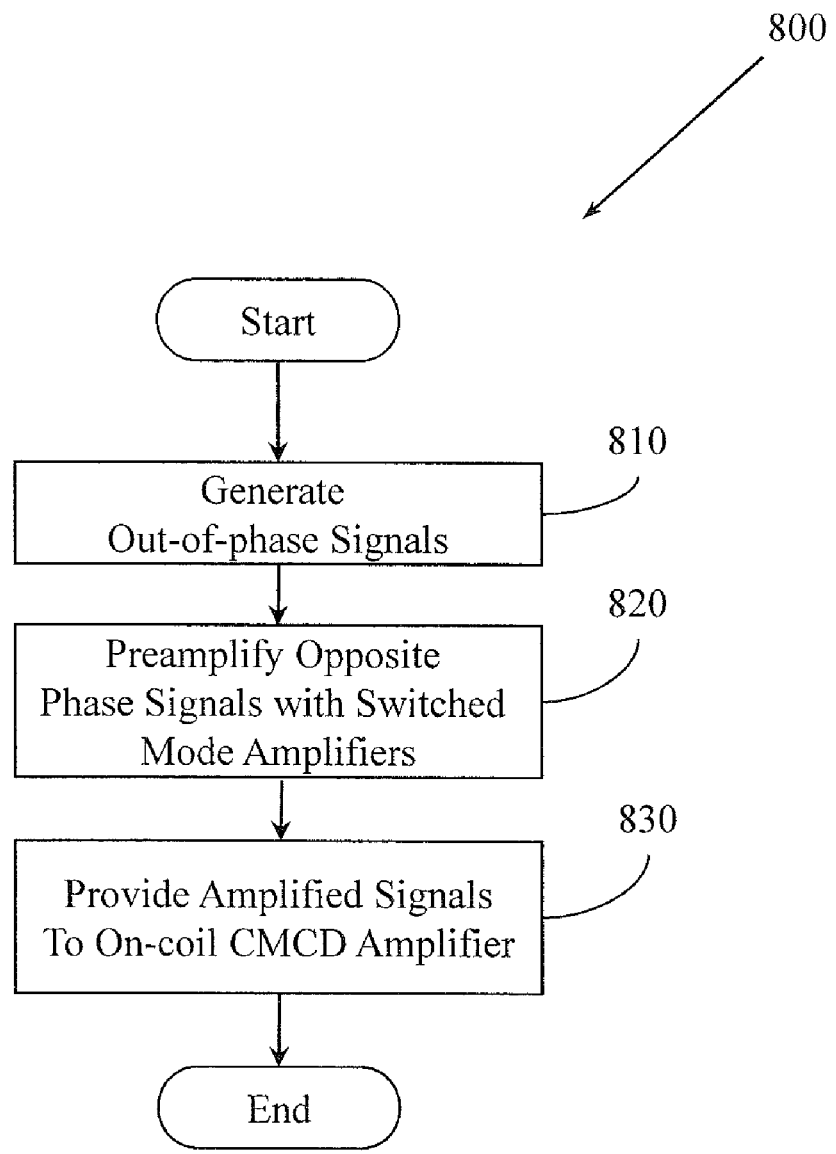
FIG. 8 illustrates a method associated with parallel transmission in magnetic resonance imaging.

FIG. 8 illustrates a method 800 associated with parallel transmission MRI. The method includes, at 810, generating first and second out-of-phase signals. At 820 the first and second out-of-phase signals are amplified with respective first and second VMCD amplifiers. At 830 the amplified out-of-phase signals are provided to an on-coil CMCD amplifier that drives an L-C leg to excite an MRI transmit coil to transmit an RF signal.

To generate the out-of-phase signals, the method may include amplifying a digitally encoded RF pulse and outputting two out-of-phase digital signals, demodulating the two out-of-phase signals, amplifying the demodulated out-of-phase signals, and inputting the amplified demodulated out-of-phase signals to the VMCD amplifiers as the first and second out-of-phase signals. The method may also include receiving a signal indicative of an envelope of the digitally encoded RF pulse, providing a signal indicative of an envelope of a transmit coil current to the feedback controller, and controlling the on-coil CMCD amplifier to produce the RF signal based, at least in part, on a comparison between the envelope of the digitally encoded RF pulse and the envelope of the transmit coil current.

Figure 9:
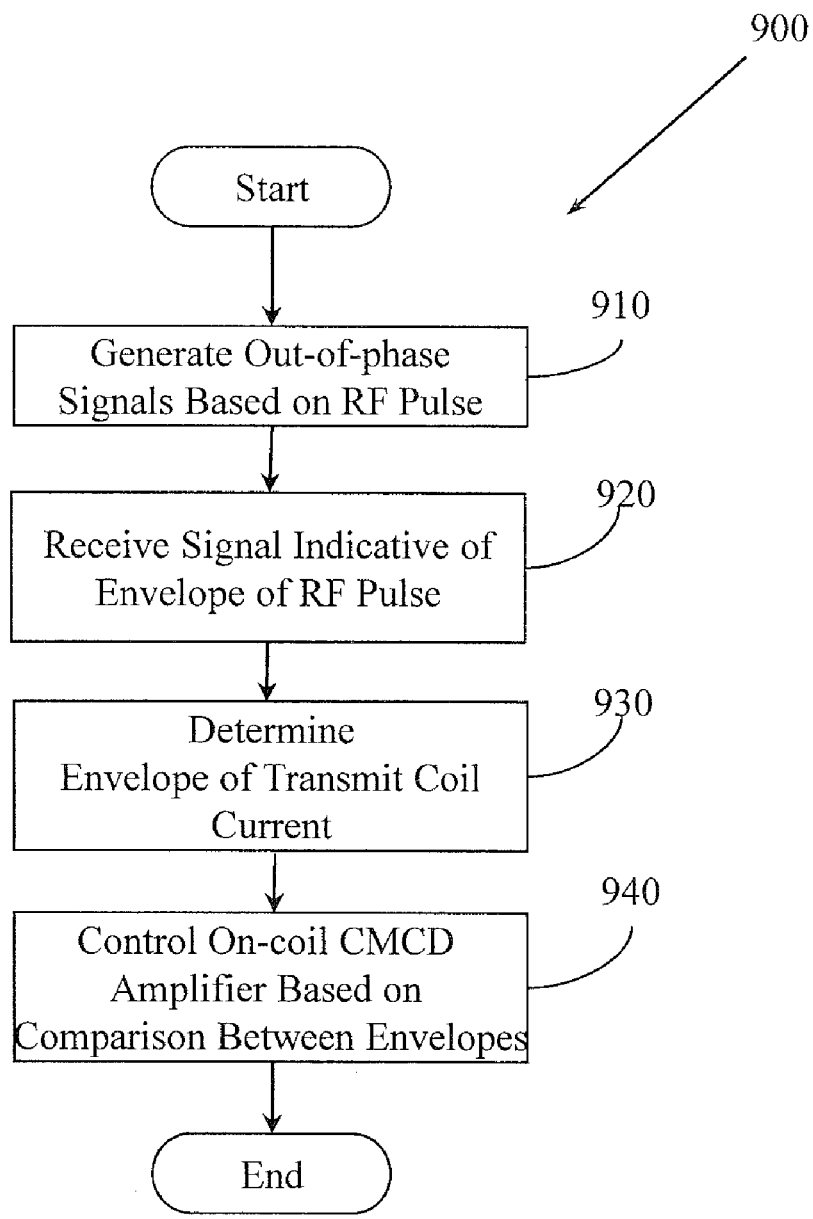
FIG. 9 illustrates a method associated with parallel transmission in magnetic resonance imaging.

FIG. 9 illustrates a method 900 associated with parallel transmission MRI. The method includes, at 910, generating first and second out-of-phase signals based, at least in part, on a received RE pulse. The method also includes, at 920, receiving a signal indicative of an envelope of the input RF pulse. At 930 an envelope of an MRI transmit coil current is determined. At 940 the on-coil CMCD amplifier is controlled to produce an analog RF signal based, at least in part, on a comparison between the envelope of the input RF pulse and the envelope of the transmit coil current modulating an amplitude of the output analog RF signal. The controlling of the CMCD amplifier may be performed by regulating a CMCD voltage provided by the CMCD amplifier according to a pulse-width-modulation (PWM) signal produced based, at least in part, on the comparison between the envelope of the input RF pulse and the envelope of the transmit coil.

Figure 10:
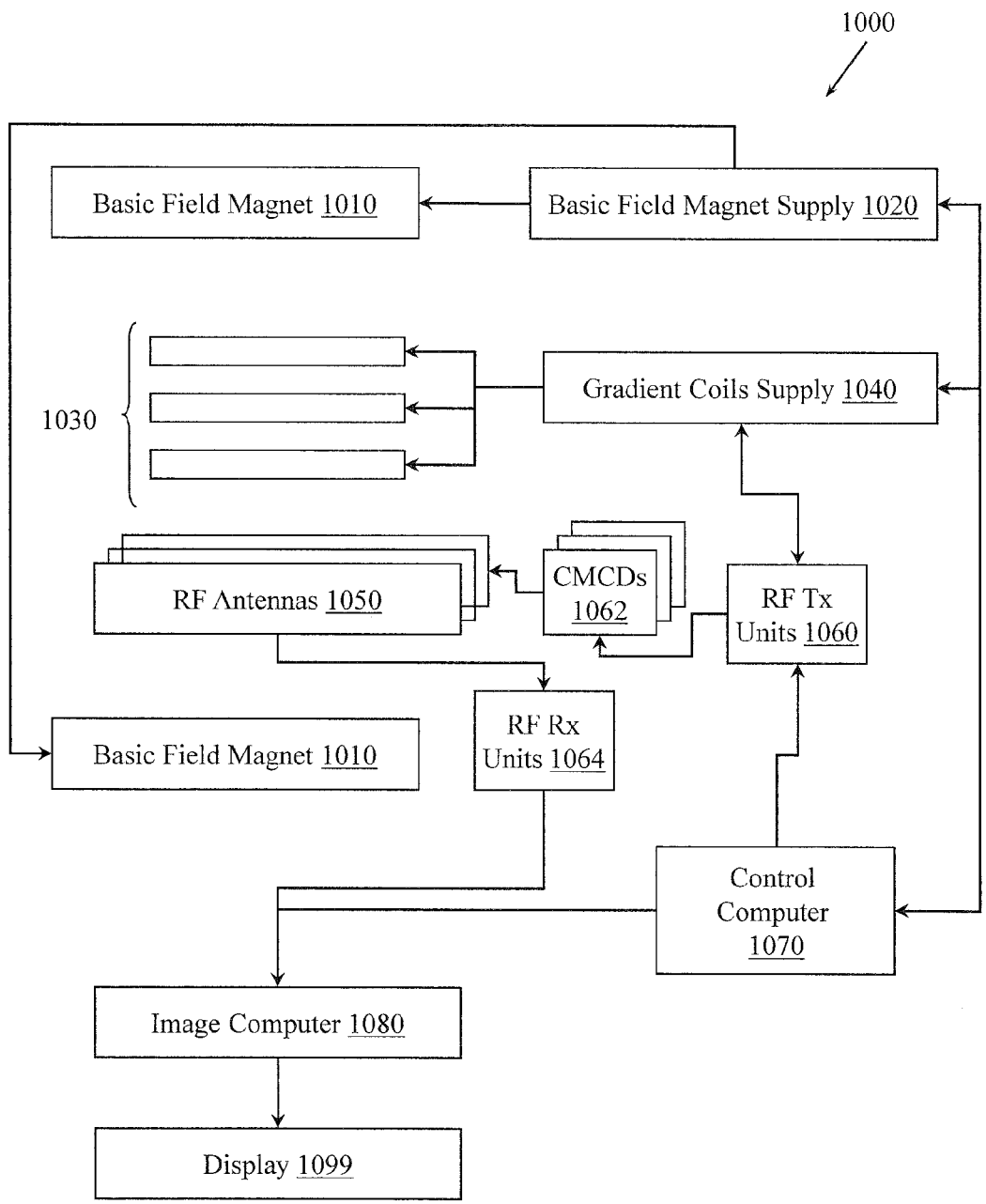
FIG. 10 illustrates an MRI apparatus configured with multiple CMCD amplifiers.

FIG. 10 illustrates an example MRI apparatus 1000 configured with a set of on-coil switched mode amplifiers 1062 to facilitate improved parallel transmission of analog RF signals used in MRI. RF antennas 1050 may correspond in part to L-C leg 310 (FIG. 3). CMCD amplifiers 1062 may correspond in part to CMCD amplifiers 430, 530, 630, 730 (FIGS. 4-7). The RF transmission (TX) units 1060 may correspond to out-of-phase signal generators 410, 510, 610, 710. (FIGS. 4-7).

The apparatus 1000 includes a basic field magnet(s) 1010 and a basic field magnet supply 1020. Ideally, the basic field magnets 1010 would produce a uniform $B_0$ field. However, in practice, the $B_0$ field may not be uniform, and may vary over an object being imaged by the MRI apparatus 1000. MRI apparatus 1000 may include gradient coils 1030 configured to emit gradient magnetic fields like $G_S$, $G_P$ and $G_R$. The gradient coils 1030 may be controlled, at least in part, by a gradient coils supply 1040. In some examples, the timing, strength, and orientation of the gradient magnetic fields may be controlled, and thus selectively adapted during an MRI procedure.

MRI apparatus 1000 may include a set of RF antennas 1050 that are configured to generate RF pulses and to receive resulting magnetic resonance signals from an object to which the RF pulses are directed. In one example, the RF antennas 1050 may be considered to correspond, at least in part, to element L-C leg 310 (FIG. 3). In some examples, how the pulses are generated and how the resulting MR signals are received may be controlled and thus may be selectively adapted during an MRI procedure. Separate RF transmission and reception coils can be employed. The RF antennas 1050 may be controlled, at least in part, by a set of RF transmission units 1060. An RF transmission unit 1060 may provide a signal to a CMCD amplifier 1062, which may manipulate the signal and provide a different signal to the RF antenna 1050. The signal may be manipulated (e.g., amplified) according to approaches described above in connection with FIGS. 3-7.

The gradient coils supply 1040 and the RF transmission units 1060 may be controlled, at least in part, by a control computer 1070. In one example, the control computer 1070 may be programmed to perform methods like those described herein. The magnetic resonance signals received from the RF antennas 1050 can be employed to generate an image, and thus may be subject to a transformation process like a two dimensional FFT that generates pixilated image data. The transformation can be performed by an image computer 1080 or other similar processing device. The image data may then be shown on a display 1099. While FIG. 10 illustrates an example MRI apparatus 1000 that includes various components connected in various ways, it is to be appreciated that other MRI apparatus may include other components connected in other ways.

In one example, MRI apparatus 1000 may include control computer 1070 and a digital controller operably connected to the CMCD amplifiers 1062. The CMCD amplifiers 1062 may include a set of L-C-switched-mode coils operably connected to the digital controller. In one example, a member of the set of L-C-switched-mode coils may be individually controllable by the control computer 1070. Additionally, the control computer 1070 may provide an L-C-switched-mode coil with a digital control signal and the L-C-switched-mode coil may output an analog RF signal based, at least in part, on the digital control signal.

In one example, the set of L-C-switched mode coils may be operably connected to the control computer 1070 by dedicated connections. The dedicated connections may include be a copper cable, a fiber optic cable, a wireless connection, and so on. In one example, the L-C-switched-mode coil may be operably connected to a local memory that stores bit patterns that control production of the analog RF signal. Thus, the digital control signal may identify a stored bit pattern.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
   an out-of-phase signal generator to generate first and second out-of-phase RF signals; and
   first and second switched voltage-mode class-D (VMCD) amplifiers electrically coupled to the out-of-phase signal generator, the first VMCD amplifier to amplify the first out-of-phase RF signal and the second VMCD amplifier to amplify the second out-of-phase RF signal, the first and second VMCD amplifiers connected to one another in a push-pull configuration;
   where the first VMCD amplifier produces an amplified first out-of-phase signal configured to drive a first current-mode class-D (CMCD) amplifier field effect transistor (FET), and where the second VMCD amplifier produces an amplified second out-of-phase signal configured to drive a second CMCD amplifier FET, the first and second CMCD amplifier FETs being connected by a coil including an LC (inductance-capacitance) leg to define an on-coil CMCD amplifier that controls production of an output analog radio frequency (RF) signal by a transmit coil associated with parallel magnetic resonance imaging (MRI) transmission.

2. The apparatus of claim 1, where the first and second VMCD amplifiers comprise first and second FETs in a common-source configuration with gates connected to the output of the out-of-phase signal generator and drains connected to respective first and second VMCD amplifier voltages.

3. The apparatus of claim 1, where the out-of-phase signal generator comprises:
   a comparator to amplify a digitally encoded RF pulse and output two out-of-phase digital signals;
   a demodulator to demodulate the two out-of-phase signals; and
   at least one differential amplifier to amplify the demodulated out-of-phase signals; and
   where the amplified demodulated out-of-phase signals correspond to the first and second out-of-phase signals input to the first and second VMCD amplifiers.

4. The apparatus of claim 3, comprising:
   a feedback controller to receive a signal indicative of an envelope of the digitally encoded RF pulse; and
   an envelope detector to provide a signal indicative of an envelope of a transmit coil current to the feedback controller;
   where the feedback controller controls the on-coil CMCD amplifier to produce the RF signal based, at least in part, on a comparison between the envelope of the digitally encoded RF pulse and the envelope of the transmit coil current.

5. The apparatus of claim 4, where the envelope detector comprises a current sensor coupled to the transmit coil.

6. The apparatus of claim 4, where the feedback controller modulates an amplitude of the output analog RF signal by regulating a CMCD voltage provided by the CMCD amplifier according to a pulse-width-modulation (PWM) signal produced based, at least in part, on the comparison between the envelope of the digitally encoded RF pulse and the envelope of the transmit coil.

7. An MRI apparatus, comprising:
   an out-of-phase signal generator to generate first and second out-of-phase RF signals; and
   first and second VMCD amplifiers electrically coupled to the out-of-phase signal generator, the first VMCD amplifier to amplify the first out-of-phase RF signal and the second VMCD amplifier to amplify the second out-of-phase RF signal, the first and second VMCD amplifiers connected to one another in a push-pull configuration; and
   where the first and second VMCD amplifiers produce amplified first and second out-of-phase signals configure to drive an L-C switched-mode transmit coil that outputs an analog RF signal at a desired frequency.

8. The apparatus of claim 7, where the out-of-phase signal generator comprises:
   a comparator to amplify a digitally encoded RF pulse and output two out-of-phase digital signals;
   a demodulator to demodulate the two out-of-phase signals; and
   at least one differential amplifier to amplify the demodulated out-of-phase signals;
   where the amplified demodulated out-of-phase signals correspond to the first and second out-of-phase signals input to the first and second VMCD amplifiers.

9. The apparatus of claim 8, comprising:
   a feedback controller to receive a signal indicative of an envelope of the digitally encoded RF pulse; and
   an envelope detector to provide a signal indicative of an envelope of a transmit coil current to the feedback controller;
   where the feedback controller controls the on-coil CMCD amplifier to produce the RF signal based, at least in part, on a comparison between the envelope of the digitally encoded RF pulse and the envelope of the transmit coil current.

10. A method, comprising:
generating first and second out-of-phase signals;
amplifying the first and second out-of-phase signals with respective first and second VMCD amplifiers; and
providing the amplified out-of-phase signals to an on-coil CMCD amplifier that drives an L-C leg to excite an MRI transmit coil to transmit an RF signal.

11. The method of claim 10, where the out-of-phase signal is generated by:
amplifying a digitally encoded RF pulse and outputting two out-of-phase digital signals;
demodulating the two out-of-phase signals;
amplifying the demodulated out-of-phase signals; and
inputting the amplified demodulated out-of-phase signals to the VMCD amplifiers as the first and second out-of-phase signals.

12. The method of claim 11, comprising:
receiving a signal indicative of an envelope of the digitally encoded RF pulse;
determining an envelope of a transmit coil current to the feedback controller; and
controlling the on-coil CMCD amplifier to produce the RF signal based, at least in part, on a comparison between the envelope of the digitally encoded RF pulse and the envelope of the transmit coil current.

13. An apparatus, comprising:
an out-of-phase signal generator to generate first and second out-of-phase RF signals based on an input RF pulse having a desired frequency, where the first out-of-phase signal is configured to drive a first CMCD amplifier FET, and where the second out-of-phase signal is configured to drive a second CMCD amplifier FET, the first and second CMCD amplifier FETs being connected by a coil including an LC leg to define an on-coil CMCD amplifier associated with a parallel MRI transmit coil that outputs an analog RF signal at the desired frequency;
a feedback controller to receive a signal indicative of an envelope of the input RF pulse; and
an envelope detector to provide a signal indicative of an envelope of a transmit coil current to the feedback controller;
where the feedback controller controls the on-coil CMCD amplifier to produce the RF signal based, at least in part, on a comparison between the envelope of the digitally encoded RF pulse and the envelope of the transmit coil current.

14. The apparatus of claim 13 where the out-of-phase signal generator comprises:
a comparator to amplify a digitally encoded RF pulse and output two out-of-phase digital signals;
a demodulator to demodulate the two out-of-phase signals;
at least one differential amplifier to amplify the demodulated out-of-phase signals; and
first and second switched VMCD amplifiers to further amplify the demodulated out-of-phase signals output by the differential amplifier; and where outputs of the VMCD amplifiers correspond to the first and second out-of-phase signals input to the first and second CMCD amplifiers.

15. The apparatus of claim 14 where the envelope detector comprises a wire loop electrically coupled to the transmit coil.

16. The apparatus of claim 14 where the feedback controller modulates an amplitude of the output analog RF signal by regulating a CMCD voltage provided by the CMCD amplifier according to a pulse-width-modulation (PWM) signal produced based, at least in part, on the comparison between the envelope of the digitally encoded RF pulse and the envelope of the transmit coil.

17. An MRI apparatus, comprising:
an out-of-phase signal generator to generate first and second out-of-phase RF signals based on an input RF pulse having a desired frequency, where the first and second out-of-phase signals are configured to drive an L-C switched-mode transmit coil that outputs an analog RF signal at a desired frequency;
a feedback controller to receive a signal indicative of an envelope of the input RF pulse; and
an envelope detector to provide a signal indicative of an envelope of a transmit coil current to the feedback controller;
where the feedback controller controls the on-coil CMCD amplifier to produce the RF signal based, at least in part, on a comparison between the envelope of the input RF pulse and the envelope of the transmit coil current.

18. The apparatus of claim 17 where the input RF pulse is digitally encoded and the out-of-phase signal generator comprises:
a comparator to amplify the digitally encoded RF pulse and output two out-of-phase digital signals;
a demodulator to demodulate the two out-of-phase signals;
at least one differential amplifier to amplify the demodulated out-of-phase signals; and
first and second switched VMCD amplifiers to further amplify the demodulated out-of-phase signals output by the differential amplifier; and where outputs of the VMCD amplifiers correspond to the first and second out-of-phase signals input to the first and second CMCD amplifiers.

19. The apparatus of claim 17 where the envelope detector comprises a current sensor coupled to the transmit coil.

20. The apparatus of claim 17 where the feedback controller modulates an amplitude of the output analog RF signal by regulating a CMCD voltage provided by the CMCD amplifier according to a pulse-width-modulation (PWM) signal produced based, at least in part, on the comparison between the envelope of the input RF pulse and the envelope of the transmit coil.

21. A method, comprising:
generating first and second out-of-phase signals based, at least in part, on a received RF pulse;
receiving a signal indicative of an envelope of the input RF pulse;
determining an envelope of an MRI transmit coil current; and
controlling an on-coil CMCD amplifier to produce an analog RF signal based, at least in part, on a comparison between the envelope of the digitally encoded RF pulse and the envelope of the transmit coil current.

22. The method of claim 21 where the out-of-phase signal is generated by:
amplifying a digitally encoded RF pulse and outputting two out-of-phase digital signals;
demodulating the two out-of-phase signals;
amplifying the demodulated out-of-phase signals; and
inputting the amplified demodulated out-of-phase signals to the switched mode amplifiers as the first and second out-of-phase.

23. The method of claim 21 comprising detecting the envelope of the transmit coil with a wire loop coupled to the transmit coil.

24. The method of claim 21 comprising modulating an amplitude of the output analog RF signal by regulating a CMCD provided by the CMCD amplifier according to a pulse-width-modulation (PWM) signal produced based, at least in part, on the comparison between the envelope of the digitally encoded RF pulse and the envelope of the transmit coil.

* * * * *